United States Patent
Choe

(10) Patent No.: US 8,476,619 B2
(45) Date of Patent: Jul. 2, 2013

(54) SEMICONDUCTOR DEVICE AND METHOD FOR FABRICATING THE SAME

(75) Inventor: Ki-Beom Choe, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 12/825,805

(22) Filed: Jun. 29, 2010

(65) Prior Publication Data

US 2011/0156010 A1 Jun. 30, 2011

(30) Foreign Application Priority Data

Dec. 29, 2009 (KR) ........................ 10-2009-0132812

(51) Int. Cl.
 *H01L 51/00* (2006.01)
(52) U.S. Cl.
 USPC ..................................... 257/40; 257/E51.006
(58) Field of Classification Search
 USPC .................. 257/E51.006, E21.007, E21.299, 257/E27.117, 40
 See application file for complete search history.

(56) References Cited

U.S. PATENT DOCUMENTS

| | | | |
|---|---|---|---|
| 8,283,658 B2* | 10/2012 | Choe | 257/40 |
| 2006/0027860 A1* | 2/2006 | Nomoto | 257/327 |
| 2010/0244000 A1* | 9/2010 | Tanaka et al. | 257/40 |
| 2010/0301311 A1* | 12/2010 | Oku | 257/40 |
| 2010/0320453 A1* | 12/2010 | Tanaka et al. | 257/40 |
| 2011/0001132 A1* | 1/2011 | Choe | 257/40 |
| 2011/0156010 A1* | 6/2011 | Choe | 257/40 |

FOREIGN PATENT DOCUMENTS

| | | |
|---|---|---|
| JP | 2000-269484 | 9/2000 |
| JP | 2002-319674 | 10/2002 |
| JP | 2004-111611 | 4/2004 |
| KR | 1020080069427 | 7/2008 |

OTHER PUBLICATIONS

Notice of Allowance issued by the Korean Intellectual Property Office on Nov. 30, 2011.

* cited by examiner

*Primary Examiner* — David Vu
*Assistant Examiner* — Earl Taylor
(74) *Attorney, Agent, or Firm* — IP & T Group LLP

(57) ABSTRACT

A semiconductor device includes a gate formed over a substrate, organic semiconductor pattern interposed between the substrate and the gate, junction regions formed in the substrate on both sides of the gate, and junction patterns formed over the junction regions to contact the organic semiconductor patterns.

9 Claims, 6 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2009-0132812, filed on Dec. 29, 2009, which is incorporated herein by reference in its entirety.

BACKGROUND OF THE INVENTION

Exemplary embodiments of the present invention relate to a semiconductor device fabrication technology, and more particularly, to a semiconductor device and a method for fabricating the same, which may substantially reduce the occurrence of gate induced drain leakage (GIDL) current.

As the degree of integration of a semiconductor device increases, a channel length decreases. Also, as the channel length decreases, the operation characteristics of the semiconductor device are gradually degraded.

FIG. 1 is a cross-sectional view illustrating a conventional semiconductor device.

Describing a conventional method for fabricating a semiconductor device, a threshold voltage regulation layer 19 for regulating a threshold voltage may be formed in a substrate 11 by implanting ion impurities. A gate 16 may be formed to have a structure in which a gate dielectric layer 12, a first gate electrode 13, a second gate electrode 14 and a gate hard mask layer 15 are stacked. Subsequently, spacers 17 may be formed on both sides of the gate 16. Junction regions 18 may be formed in the substrate 11 on both sides of the gate 16. Since the junction regions 18 may be formed through implantation of ion impurities and an annealing process, the gate 16 and the junction regions 18 may be formed to partially overlap with each other.

According to the conventional semiconductor device, since the gate 16 and the junction regions 18 may be formed to partially overlap with each other, gate-induced drain leakage (GIDL) current may occur in areas where the gate 16 and the junction regions 18 overlap with each other (see the reference character 'A'). In detail, in the conventional semiconductor device having the above-described construction, even if a transistor of the semiconductor device is in an "off" state, that is, in a state in which a bias is not applied to the gate 16, electric fields may be created in the areas where the gate 16 and the junction regions 18 overlap with each other, and thus GIDL current may occur. Due to this fact, "off" state properties of the transistor of the semiconductor device may be degraded.

Furthermore, as a size of the transistor of the semiconductor device decreases, the GIDL current may increase because the impurity doping concentration of the threshold voltage regulation layer 19 may be increased so as to maintain a threshold voltage, and thus the "off" state properties of the transistor of the semiconductor device may be degraded.

SUMMARY OF THE INVENTION

An exemplary embodiment of the present invention is directed to a semiconductor device and a method for fabricating the same, which may reduce the occurrence of gate induced drain leakage (GIDL) current.

In accordance with an exemplary embodiment of the present invention, a semiconductor device includes a gate formed over a substrate, an organic semiconductor pattern interposed between the substrate and the gate, junction regions formed in the substrate on both sides of the gate, and junction patterns formed over the junction regions to contact the organic semiconductor pattern.

The organic semiconductor pattern may include at least two patterns which are interposed between the substrate and each side portion of the gate.

In accordance with another exemplary embodiment of the present invention, a method for fabricating a semiconductor device includes forming junction patterns over a substrate, forming an organic semiconductor pattern between the junction patterns, forming a gate over the substrate in such a way as to cover the organic semiconductor pattern, and forming junction regions in the substrate under the junction patterns on both sides of the gate.

In accordance with the exemplary embodiments of the present invention, the occurrence of leakage current, for example, GIDL current, may be reduced.

DESCRIPTION OF SPECIFIC EMBODIMENTS

Figure 1:
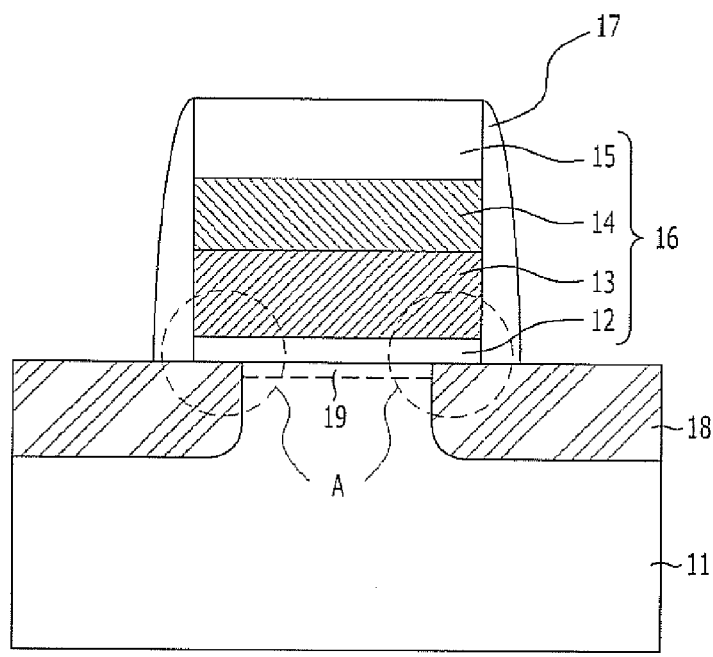
FIG. 1 is a cross-sectional view illustrating a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
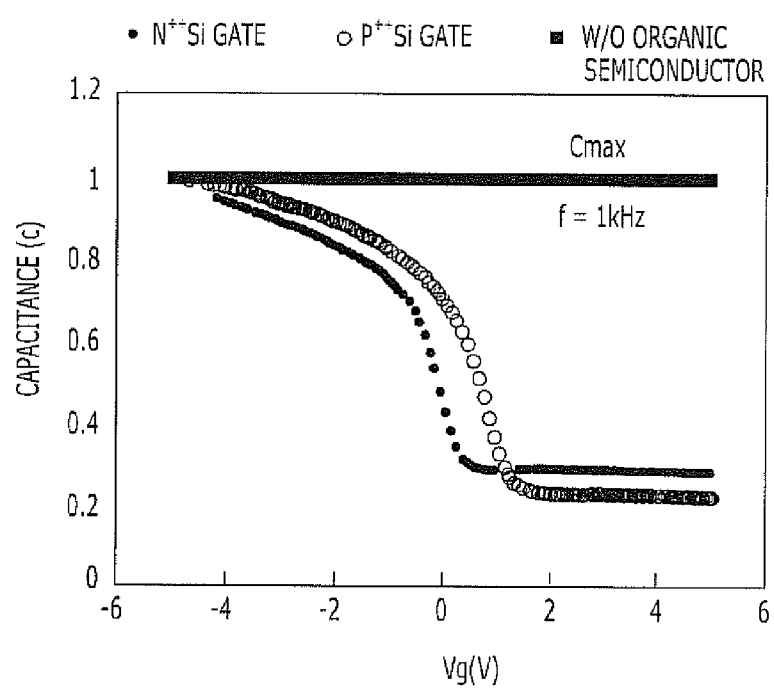
FIG. 2 is a graph for explaining the electrical characteristics of an organic semiconductor.

FIG. 2 is a graph for explaining the electrical characteristics of an organic semiconductor.

Hereinafter, electrical characteristics of an organic semiconductor will be described with reference to FIG. 2 which shows a change in capacitance depending upon a change in voltage applied to the organic semiconductor.

More specifically, FIG. 2 shows the electrical characteristics of an organic semiconductor having a structure in which a thermal oxide layer is formed on a heavily doped silicon semiconductor, pentacene as a P-type organic semiconductor is formed on the thermal oxide layer, and a gate electrode comprising a metal such as gold (Au) is formed on the pentacene.

The reference 'Cmax' represents the capacitance of an oxide layer in an apparatus which does not have an organic semiconductor, that is, in a structure in which a thermal oxide layer is formed on a heavily doped silicon semiconductor and a gate electrode comprising metal materials such as gold (Au) is formed directly on the thermal oxide layer.

Next, the electrical characteristics of the organic semiconductor in an apparatus in which the organic semiconductor is formed between the gate electrode and the oxide layer are described. In the case where a positive bias is applied to the gate electrode, the capacitance of the apparatus containing the organic substrate may have a small value. This is because the organic semiconductor on the thermal oxide layer may serve as another dielectric layer, and therefore, the thickness of a dielectric layer between two electrodes may increase. In the case where a negative bias is applied to the gate electrode, a measured capacitance may increase up to a degree that substantially corresponds to the capacitance of the thermal oxide layer. This is because the positive charges in the organic semiconductor may migrate toward the thermal oxide layer and the positive charges accumulated in this way may serve as an electrode on the portion of the thermal oxide layer facing away from the gate electrode. Thus, the capacitance of the organic semiconductor may disappear and only the capacitance of the thermal oxide layer may be measured.

Therefore, the fact that the positive charges accumulated in this way may serve as an electrode and that the organic semiconductor forms a channel if the negative bias is applied means that the pentacene used as the organic semiconductor may have characteristics of a P-type semiconductor.

Based on the characteristics of the organic semiconductor as described above, the present invention provides a semiconductor device and a method for fabricating the same, which can reduce a degradation of the "off" state properties of a transistor of the semiconductor device due to the occurrence of gate-induced drain leakage (GIDL) current. To this end, exemplary embodiments of the present invention may be characterized in that an organic semiconductor pattern is interposed between the substrate and the gate.

Figure 3:
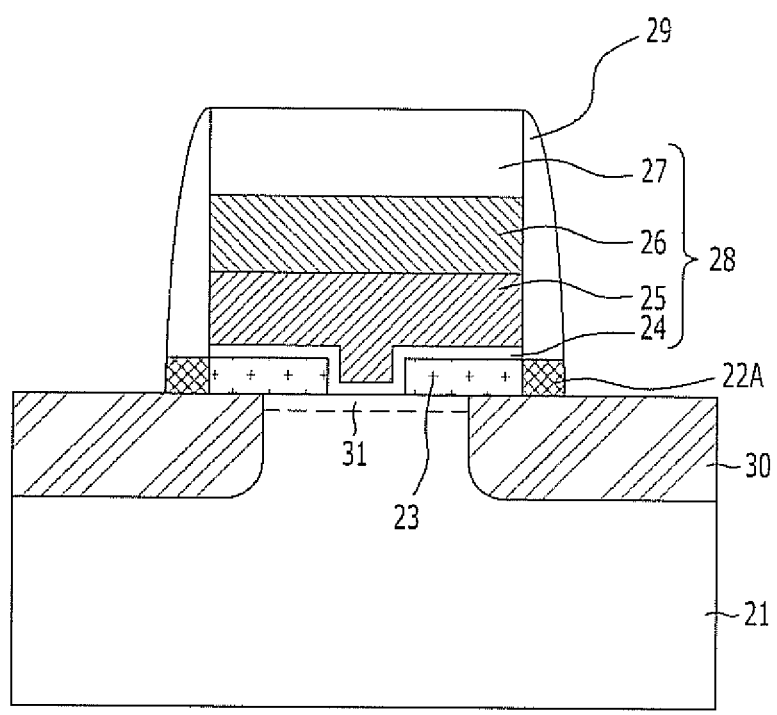
FIG. 3 is a cross-sectional view illustrating a semiconductor device in accordance with an exemplary embodiment of the present invention.

FIG. 3 is a cross-sectional view illustrating a semiconductor device in accordance with an exemplary embodiment of the present invention.

Referring to FIG. 3, a semiconductor device in accordance with an exemplary embodiment of the present invention may include a gate 28 which is formed on a substrate 21, an organic semiconductor pattern 23 which is interposed between the substrate 21 and the gate 28, junction regions 30 which are formed in the substrate 21 on both sides of the gate 28, and junction patterns 22A which are formed over the junction regions to contact opposite sides of the organic semiconductor pattern 23. The junction regions 30 may be formed to partially overlap with the organic semiconductor pattern 23.

The organic semiconductor pattern 23 may serve as channels in a state in which a bias is applied to the gate 28, that is, in an "on" state, and may serve as a barrier layer for reducing leakage current, for example, GIDL current, due to the bias applied to the junction regions 30, in a state in which a bias is not applied to the gate 28, that is, in an "off" state. The organic semiconductor pattern 23 functioning as described above may be formed of a perylene diimide derivative having an N-type conductivity or pentacene or phthalocyanine having a P-type conductivity. For reference, the conductivity type of an organic semiconductor may not be determined depending upon the kind of doped impurities unlike an inorganic semiconductor such as silicon, and the organic semiconductor may be divided into a P-type or an N-type depending upon the structure of molecules constituting an organic semiconductor layer and the conductive properties of carriers.

The reason that the organic semiconductor pattern 23 may reduce the GIDL current when a bias is not applied to the gate 28 may be that an organic semiconductor may have insulation properties when energy (for example, a voltage or an electric field) is not applied from an outside. That is to say, in the "off" state in which a bias is not applied to the gate 28, the organic semiconductor pattern 23 may serve as a dielectric layer (or a barrier layer), and thus, the capacitance between the gate 28 and the junction regions 30 may decrease and an electric field between the gate 28 and the junction regions 30 may be reduced. Therefore, a probability of the occurrence of the GIDL current, which substantially depends on the electric field between the gate 28 and the junction regions 30, may decrease.

Conversely, in the "on" state in which a bias is applied to the gate 28, an inversion layer may be formed in the substrate 21 under the gate 28, and at the same time, conductive paths may be formed in the organic semiconductor pattern 23. That is, channels may be formed in the organic semiconductor pattern 23 as carriers are concentrated on the surface of the organic semiconductor pattern 23 contacting the gate 28, in response to the bias applied to the gate 28. In this state, a normal operation of the transistor of the semiconductor device may become possible.

Figure 5:
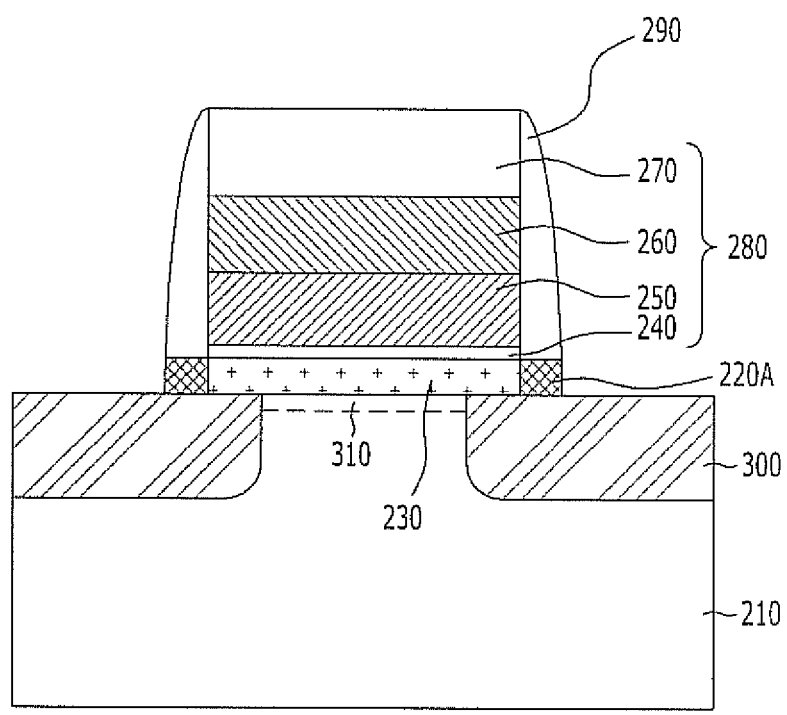
FIG. 5 is a cross-sectional view illustrating a semiconductor device in accordance with another exemplary embodiment of the present invention.

The organic semiconductor pattern 23 may have a structure in which it overlaps with both side portions of the gate 28 as shown in the FIG. 3 or a structure in which it overlaps with the entire gate 28 as shown in the FIG. 5. Because charge mobility is generally better in an inorganic semiconductor, for example, silicon (or silicon doped with impurities) than in an organic semiconductor, for purposes of improving the operating speed of the transistor of the semiconductor device, the organic semiconductor pattern 23 may be formed to have the structure in which it overlaps with both side portions of the gate 28 as shown in the FIG. 3.

FIG. 5 is a cross-sectional view illustrating a semiconductor device in accordance with another exemplary embodiment of the present invention.

Referring to FIG. 5, as mentioned above, a semiconductor device in accordance with another exemplary embodiment of the present invention may include a gate 280 which is formed on a substrate 210, organic semiconductor pattern 230 which is interposed between the substrate 210 and the gate 280, junction regions 300 which are formed in the substrate 210 on both sides of the gate 280, and junction patterns 220A which are formed over the junction regions to contact opposite sides of the organic semiconductor pattern 230. The junction regions 300 may be formed to partially overlap with the organic semiconductor patterns 230.

Furthermore, the organic semiconductor pattern 23 may have a conductivity type the same as the junction regions 30 and complementary to the substrate 21. For example, the organic semiconductor pattern 23 and the junction regions 30 may have an N-type conductivity, and the substrate 21 may have a P-type conductivity in the case of an NMOS transistor. Also, the organic semiconductor pattern 23 and the junction regions 30 may have a P-type conductivity and the substrate 21 may have an N-type conductivity in the case of a PMOS transistor.

The junction patterns 22A contacting the sides of the organic semiconductor pattern 23 may serve to connect the junction regions 30 and the organic semiconductor pattern 23.

That is, the junction patterns 22A may serve as an extended part of the junction regions 30. Accordingly, the junction patterns 22A may be formed of a conductive material. Further, a silicon layer, a metallic layer, etc. may be used as the conductive material.

Observing the distribution of charges in the organic semiconductor pattern 23 in the "on" state in which a bias is applied to the gate 28, charges may migrate toward the interface of the organic semiconductor pattern 23 contacting the gate 28, that is, the upper areas of the organic semiconductor pattern 23. At the same time that channels are formed, a state in which no charges exist, such as in a kind of depletion area (that is, an insulation state) may be induced on the interface of the organic semiconductor pattern 23 contacting, for example, the junction regions 30. In other words, in the "on" state no charges may exist in the lower areas of the organic semiconductor pattern 23. Due to this fact, the organic semiconductor pattern 23 serving as the channels and the junction regions 30 may be electrically isolated (or insulated), and thus, the transistor of the semiconductor device may not operate normally. Therefore, for ensuring a normal operation of the transistor, the junction patterns 22A which contact the side of the organic semiconductor pattern 23 may be provided.

The gate 28 may have a structure in which a gate dielectric layer 24, a first gate electrode 25, a second gate electrode 26, and a gate hard mask layer 27 are sequentially stacked. The gate dielectric layer 24 and the gate hard mask layer 27 may be formed as any one single layer selected from the group consisting of an oxide layer, a nitride layer, and an oxynitride layer, or as a stack of any such layers. The first gate electrode 25 may be formed as a silicon layer, and the second gate electrode 26 may be formed as a metallic layer.

The sides of the gate 28 may be aligned with the interfaces of the junction patterns 22A and the organic semiconductor pattern 23. Here, for example, the entire organic semiconductor pattern 23 may serve as channels depending on the bias applied to the gate 28, and a probability of a parasitic capacitance, due to a remaining gate dielectric layer 24 on the junction patterns 22A, may decrease.

The semiconductor device in accordance with an exemplary embodiment of the present invention may further include a threshold voltage regulation layer 31, which may be formed in the substrate 21 under the gate 28, and spacers 29, which may be formed on both sides of the gate 28. The junction patterns 22A may have a shape, such that they are interposed between the spacers 29 and the substrate 21.

Since the semiconductor device in accordance with an exemplary embodiment of the present invention, constructed as mentioned above, includes the organic semiconductor pattern 23, even though a bias is applied to the junction regions 30 in the "off" state, the occurrence of leakage current, in particular, GIDL current, may be effectively suppressed. Also, even if the impurity doping concentration of the threshold voltage regulation layer 31 is increased so as to regulate the threshold voltage of the transistor of the semiconductor device, the occurrence of GIDL current may be suppressed.

FIGS. 4A through 4E are cross-sectional views illustrating the processes of a method for fabricating a semiconductor device in accordance with another exemplary embodiment of the present invention.

Figure 4A:
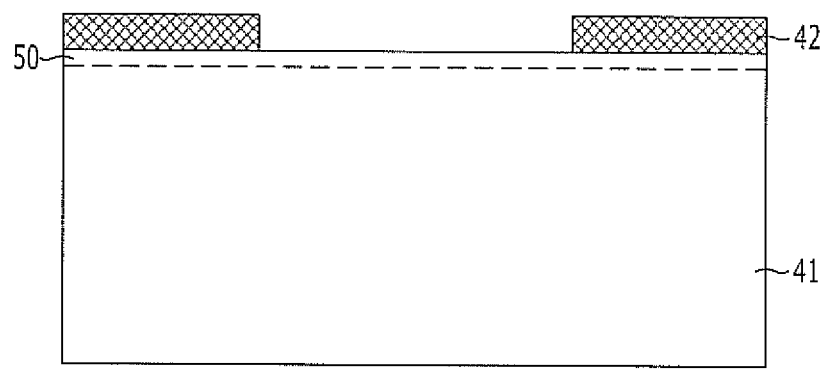
FIGS. 4A through 4E are cross-sectional views illustrating the processes of a method for fabricating a semiconductor device in accordance with another exemplary embodiment of the present invention.

Referring to FIG. 4A, a threshold voltage regulation layer 50 may be formed by implanting impurity ions into, for example, the is entire surface of a substrate 41.

Junction patterns 42 may be formed on the substrate 41. The junction patterns 42 may function to connect junction regions to an organic semiconductor pattern subsequently formed on the substrate 41, and serve as a junction to the organic semiconductor pattern. Therefore, the junction patterns 42 may be positioned over junction regions of the substrate 41, but not positioned underneath a gate .

The junction patterns 42 may be formed through a series of processes of forming a conductive layer on the substrate 41 and patterning the conductive layer such that the conductive layer does not remain in a gate area (i.e., an area including underneath where a gate is to be formed) over the substrate 41. The junction patterns 42 may be formed using a silicon layer, a metallic layer, and so forth, as the conductive layer.

Figure 4B:
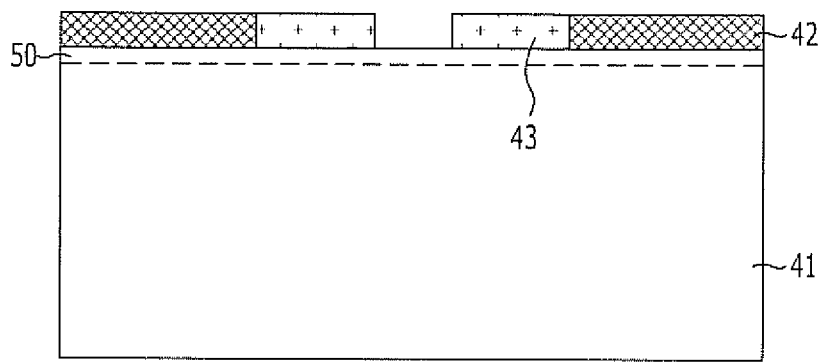

Referring to FIG. 4B, an organic semiconductor pattern 43 may be formed between the junction patterns 42 such that a side of the organic semiconductor pattern 43 contacts a side of the junction patterns 42. The organic semiconductor pattern 43 may be positioned in the gate area on the substrate 41, and may be formed such that a side of the organic semiconductor pattern 43 contacts a side of the junction patterns 42.

The organic semiconductor pattern 43 may be formed on the entire surface of the substrate 41 in the gate area as shown in FIG. 5 or can be formed to be positioned on the substrate 41 at both side portions of the gate area as shown in FIG. 3.

The organic semiconductor pattern 43 functions to suppress the occurrence of GIDL current in an "off" state and serve as channels in an "on" state. Therefore, the organic semiconductor pattern 43 may be formed to have a conductivity type complementary to the substrate 41. For example, the substrate 41 may be a P-type and the organic semiconductor pattern 43 may be an N-type in the case of an NMOS transistor, and the substrate 41 may be an N-type and the organic semiconductor pattern 43 may be a P-type in the case of a PMOS transistor.

Figure 4C:
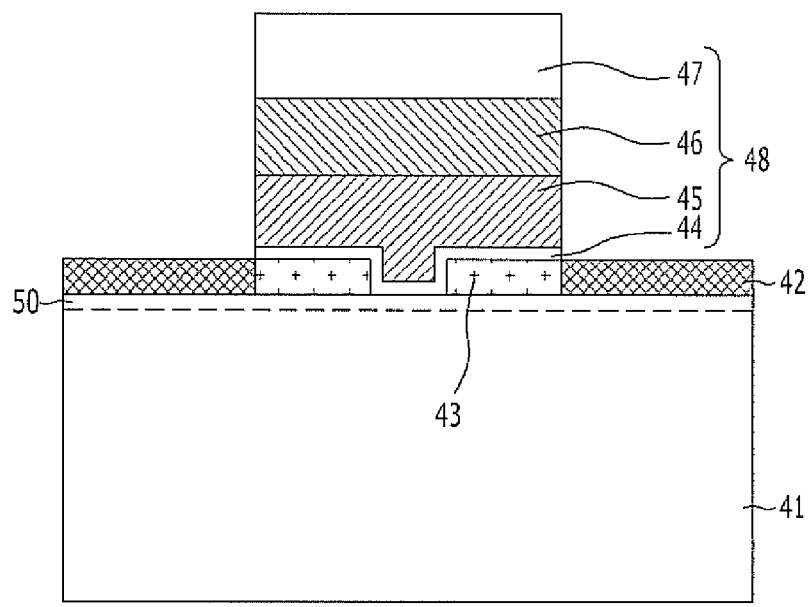

The organic semiconductor pattern 43 may include a perylene diimide derivative having an N-type conductivity or pentacene or phthalocyanine having a P-type conductivity, Referring to FIG. 4C, a gate 48 may be formed on the substrate 41 such that both side portions of the gate 48 cover (or overlap with) the organic semiconductor pattern 43. At this time, the sides of the gate 48 may be aligned with the interfaces of the junction patterns 42 and the organic semiconductor pattern 43. This is to allow the entire organic semiconductor pattern 43 to serve as channels depending on a bias applied to the gate 48. Moreover, a probability of a parasitic capacitance, due to a remaining gate dielectric layer on the junction patterns 42, may decrease.

The gate 48 may have a structure in which a gate dielectric layer 44, a first gate electrode 45, a second gate electrode 46 and a gate hard mask layer 47 are sequentially stacked. The gate dielectric layer 44 and the gate hard mask layer 47 may be formed as any one single layer selected from the group consisting of an oxide layer, a nitride layer and an oxynitride layer, or as a stack of such layers. The first gate electrode 45 may be formed as a silicon layer, and the second gate electrode 46 may be formed as a metallic layer.

Figure 4D:
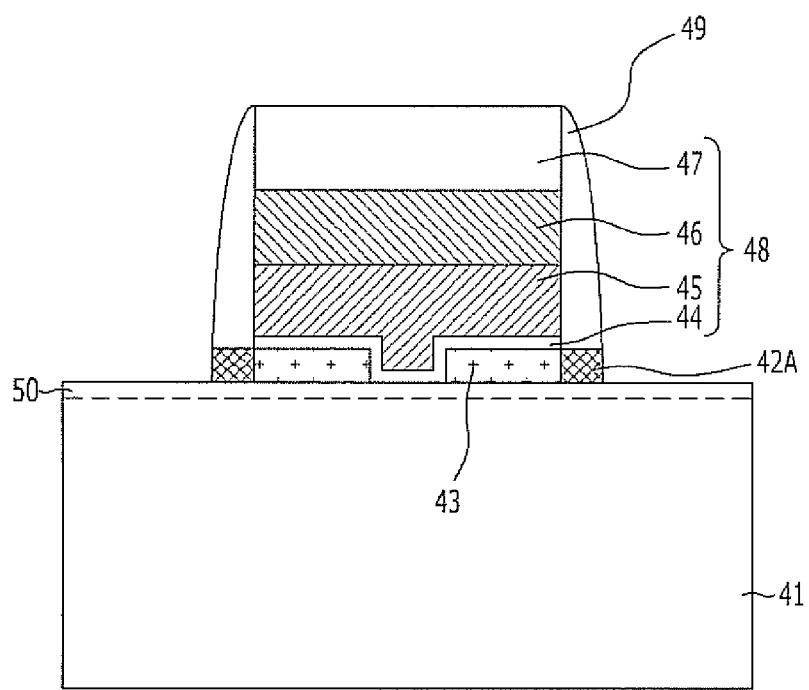

Referring to FIG. 4D, after forming a dielectric layer for a spacer on the resultant structure including the gate 48, spacers 49 may be formed on the sides of the gate 48 by conducting an etching process, for example, an etch-back process. Further, the substrate 41 may be exposed on both sides of the gate 48 by etching the junction patterns 42. Hereafter, the etched junction patterns will be designated by the reference numeral '42A'.

The reason why the junction patterns 42A are partially etched in such a way as to expose the substrate 41 while forming the spacers 49 is to allow a subsequent process for forming junction regions to be easily conducted.

Figure 4E:
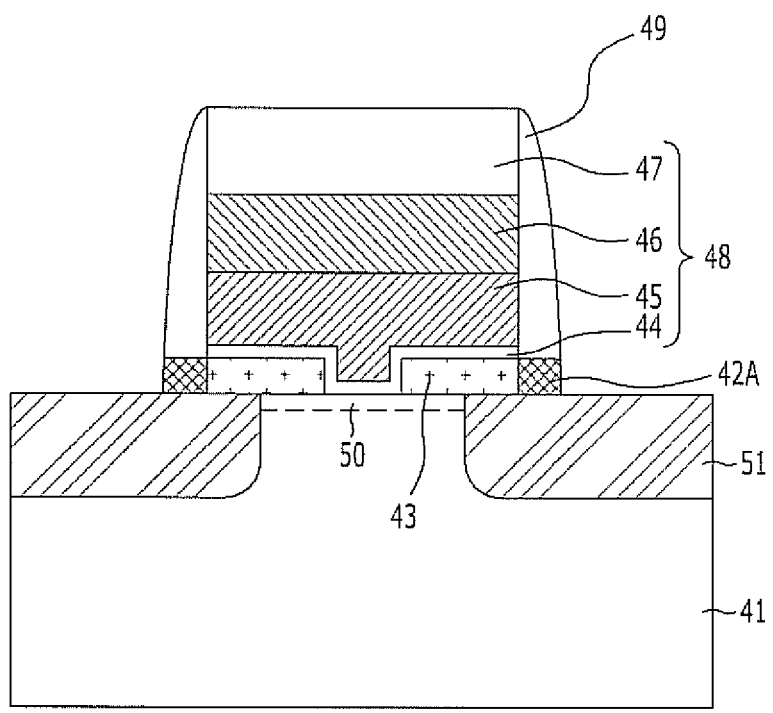

Referring to FIG. 4E, junction regions 51 may be formed in the substrate 41 on both sides of the gate 48. The junction regions 51 may be formed through implantation of impurity ions and an annealing process. The junction regions 51 may have a structure in which they partially or entirely overlap with the junction patterns 42A, the organic semiconductor pattern 43, and the gate 48 due to diffusion of the impurities implanted during the annealing process.

The junction regions 51 may be formed to have a same conductivity type as the organic semiconductor pattern 43 and complementary to the substrate 41. For example, the organic semiconductor pattern 43 and the junction regions 51 may have an N-type conductivity and the substrate 41 may have a P-type conductivity in the case of an NMOS transistor. Also, the organic semiconductor pattern 43 and the junction regions 51 may have a P-type conductivity and the substrate 41 may have an N-type conductivity in the case of a PMOS transistor.

As is apparent from the above description, since the semiconductor device fabricated through the above-described processes includes the organic semiconductor pattern 43, even though a bias is applied to the junction regions 51 in the "off" state, the occurrence of leakage current, in particular, GIDL current, may be effectively suppressed. Also, even if the impurity doping concentration of the threshold voltage regulation layer 50 is increased so as to regulate the threshold voltage of the transistor of the semiconductor device, the occurrence of GIDL current may be suppressed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a gate formed over a substrate;
   organic semiconductor patterns interposed between the substrate and the gate;
   junction regions formed in the substrate below both sides of the gate; and
   junction patterns formed over the junction regions to contact the organic semiconductor patterns.

2. The semiconductor device of claim 1, wherein each of the organic semiconductor patterns is interposed between the substrate and a corresponding one both side portions of the gate.

3. The semiconductor device of claim 1, wherein the both sides of the gate are aligned with respective interfaces of the organic semiconductor patterns and the junction patterns.

4. The semiconductor device of claim 1, wherein the substrate and the organic semiconductor patterns have conductivity types complementary to each other.

5. The semiconductor device of claim 1, wherein the organic semiconductor patterns and the junction regions have the same conductivity type.

6. The semiconductor device of claim 1, wherein each of the organic semiconductor patterns comprises pentacene or phthalocyanine having a P-type conductivity.

7. The semiconductor device of claim 1, wherein each of the organic semiconductor patterns comprises a perylene diimide derivative having an N-type conductivity.

8. The semiconductor device of claim 1, further comprising:
   a threshold voltage regulation layer formed in the substrate under the gate; and
   spacers formed on the both sides of the gate.

9. The semiconductor device of claim 8, wherein the junction patterns are interposed between the spacers and the substrate.

* * * * *